United States Patent [19]

Yu

[11] Patent Number: 5,359,571
[45] Date of Patent: Oct. 25, 1994

[54] MEMORY ARRAY HAVING A PLURALITY OF ADDRESS PARTITIONS

[76] Inventor: Shih-Chiang Yu, 10451 Davison Ave., Cupertino, Calif. 95014

[21] Appl. No.: 187,683

[22] Filed: Jan. 25, 1994

Related U.S. Application Data

[63] Continuation-in-part of Ser. No. 9,111, Jan. 27, 1993, abandoned.

[51] Int. Cl.$^5$ .............................................. G11C 8/00
[52] U.S. Cl. ........................... 365/230.03; 365/238.5; 365/189.05; 365/220; 365/185; 365/230.06; 365/900
[58] Field of Search .................. 365/230.03, 230.08, 365/238.5, 189.05, 220, 185, 230.06, 900

[56] References Cited

U.S. PATENT DOCUMENTS

| | | | |
|---|---|---|---|
| 4,099,196 | 7/1978 | Simko | 365/185 |
| 4,334,292 | 6/1982 | Kotecha | 365/182 |
| 4,511,996 | 4/1985 | Jacobs | 365/186 |
| 4,780,750 | 10/1988 | Nolan et al. | 365/185 |
| 5,280,446 | 1/1994 | Ma et al. | 365/185 |
| 5,303,187 | 4/1994 | Yu | 365/185 |

*Primary Examiner*—Eugene R. LaRoche
*Assistant Examiner*—Andrew Q. Tran
*Attorney, Agent, or Firm*—Kam T. Tam

[57] ABSTRACT

Non-volatile semiconductor memory integrated circuits which partition a main memory array into sub-arrays. Address lines of the main memory array are also partitioned into four groups. The first group and the second group are dedicated for the addressing of the sub-arrays. Each of the sub-arrays can be addressed by a simultaneous energization of a pair of address lines selected from the first and the second group. The third group and the fourth group are used for the addressing for individual memory cells in the sub-arrays. The simultaneous energization of a pair of address lines selected from the third and the fourth group can address any of the memory cells within a selected sub-array. The memory circuits of the present invention are applicable for memory cells with four terminals. In a first embodiment of the invention, the memory circuit is a one-bit wide circuit. In a second and a third embodiment of the invention, the memory circuits are designed as multi-bit-wide circuits whereby data can be programmed parallely. Moreover, in the third embodiment, storage register circuits are implemented, such that during programming, data are cumulatively loaded into the register circuits within a time period, and are simultaneously programmed into the main array within another time period. The programming and the cumulative data loading steps are executed concurrently, resulting in no idle time being wasted. As a consequence, programming can be as fast as reading for memory circuit of the third embodiment of the invention.

22 Claims, 10 Drawing Sheets

MEMORY ARRAY HAVING A PLURALITY OF ADDRESS PARTITIONS

This is a continuation-in-part of application having Ser. No. 08/099,111, filed Jan. 27, 1993, now abandoned.

BACKGROUND OF THE INVENTION

1. Field of the Invention

The present invention relates to the design of semiconductor integrated circuits. In particular, this invention is related to the architectural design of semiconductor integrated circuits having a large integration of memory cells such as Read Only Memory (ROM), Static Random Access Memory (SRAM), Dynamic Random Access Memory (DRAM), Electrically Programmable Read Only Memory (EPROM), Electrically Erasable Programmable Read Only Memory (EEPROM), and flash EEPROM.

2. Description of the Related Art

With the rapid advance in semiconductor processing technologies, semiconductor memories are widely used for the implementation of large scale memory systems. Semiconductor memories are generally classified into two types, namely, the volatile type and the non-volatile type. Examples of volatile memories are SRAM and DRAM, in which the stored data are lost in conjunction with the loss of power. While for non-volatile memories, such as ROM, EPROM and EEPROM, stored data remain with the memory cells irrespective of whether power is on or off.

There are various kinds of semiconductor memory integrated circuits with different structures and characteristics. The most commonly used are the types in which each memory cell comprises three terminals. The three terminals are respectively the source, the drain and the gate of a conventional Metal Oxide Semiconductor Field Effect Transistor (MOSFET). Take the example of a non-volatile memory circuit such as a ROM. Pre-programmed low and high threshold voltages of the MOSFET within each ROM cell correspond to the digital bits "0" and "1" stored in a ROM circuit. As yet another example, in the case with EPROM, EEPROM, or flash EEPROM, in which each memory cell includes a floating gate disposed atop a MOSFET, the threshold voltage of the MOSFET is programmable via the floating gate. Addressing of such conventional memory circuits usually involves the partition of N address lines into two groups. FIG. 1a shows such a structure. For example, the first group is labeled as $A_0, A_1, A_2, \ldots, A_{i-1}$, while the second group is identified as $A_i, A_{i+1}, A_{i+2}, \ldots, A_{N-1}$, where i is an integer. The first group of address lines, $A_0, A_1, A_2, \ldots, A_{i-1}$, are used to drive one of the x wordlines $WL_0, WL_1, WL_2, \ldots, WL_{x-1}$ through a row decoder, for example, in which x and i are related by the mathematical expression: $x=2^i$. The second group of address lines, $A_i, A_{i+1}, A_{i+2}, \ldots, A_{N-1}$, are used to select one of the y vertical bitlines, $BL_0, BL_1, BL_2, \ldots, BL_{y-1}$, through a column decoder, for example, in which y and i are related by the mathematical expression: $y=2^{N-i}$. Such an addressing scheme is especially suitable for a memory array with three-terminal storage elements. Normally, the drain terminals of the MOSFETs in a column of the matrix of memory cells are tied together to form the bitlines, while the gate terminals of the MOSFETs in a row of the matrix are tied together to form wordlines. FIG. 1b is a general schematic representation of a three-terminal storage element which may comprise either one of the memory cells as shown in FIG. 1c or FIG. 1d. FIG. 1c is a schematic representation of a ROM cell, and FIG. 1d is another schematic representation of a EPROM, EEPROM or a flash EEPROM cell. It should be noted that shown in FIG. 1a is only the core of the memory array in a matrix of rows and columns. There are also row and column decoders used for the addressing of each of the memory cells, not shown in FIG. 1a, as were mentioned previously. Alternatively, another control line can be added to the aforementioned array. The additional control line is tied to the substrate, such that the substrate of the memory cells can be raised to a predetermined voltage level for a fast sector erasure. Details of such a memory circuit can be found in a technical publication by Jinbo et al., entitled "A 5 V-Only 16 Mb Flash Memory with Sector-Erase Mode", IEEE Journal of Solid-State Circuits, Vol. 27, No. 11, November 1992, pp 1547–1553.

In an effort to increase the integration density, there are memory circuits that link the memory cells together in a NAND structure, in which the informational bits are stored serially. Such type of circuits can be found in another technical publication by Shirota et al., entitled "A 2.3 um$^2$ Memory Cell Structure for 16 Mb NAND EEPROM", IEDM 1990, Technical Digest, pp 103–106; and also in Momodomi et al., entitled "New Device Technologies for 5 V only 4 Mb EEPROM with NAND Structure Cell", IEDM 1988, Technical Digest, pp 412–415.

To facilitate the addressing of memory circuits with large main arrays, there are circuits designed in the past which divide the address lines into three groups. This is in contrast with the conventional memory circuits in which two groups of address lines are partitioned respectively for the wordlines and the bitlines. The additional group of address lines is used to address the many sub-arrays partitioned from the main array, or for the addressing of the pre-divided groups of wordlines. An example of such memory circuit can be found in Yiu, U.S. Pat. No. 5,117,389, entitled "Flat-Cell Read-Only-Memory Integrated Circuit", May 26, 1992. In Yiu, the memory circuit includes control and select transistors for each sub-array. The control and select transistors are interposed with the memory cells in the memory core. FIG. 2 shows a schematic of such a circuit. As is shown, wordlines are labeled $SWL_{N1}, SWL_{N2}, \ldots, SWL_{NM}$, while bitlines are labeled $BL_N, BL_{N+1}$. Virtual ground lines are identified as $VG_N$ and $VG_{N+1}$, and the sub-array select lines are labeled as $BWL_N$ and $BWL_{N+1}$ Memory circuits of the aforementioned types involve very complicated addressing schemes. Typically, an entire column or an entire row of memory cells in the main array are first addressed. The addressed column or row is then individually decoded for reading or programming. The associated addressing circuitries are complicated in design. Equally as undesirable, memory addressing speed is penalized as several timing cycles are involved in the accessing of the individual memory cells.

SUMMARY OF THE INVENTION

It is the main objective of the present invention to provide a memory circuit having each memory cell capable of being addressed swiftly, and without relying on complicated addressing circuitries. The objective of a large scale integration with minimal peripheral supporting circuits is also sought. The memory circuits of the present invention achieve these goals via a unique structural design.

The present invention provides semiconductor memory integrated circuits with the main memory arrays partitioned into a plurality of sub-arrays. The address lines to the main array are also partitioned into four groups. The first and second groups of the partitioned address lines are used to address the sub-arrays. The third and fourth groups of the partitioned address lines are used to address the individual memory cells within the selected sub-array. The memory circuits of the present invention are especially suitable for storage elements having four terminals. In the preferred embodiments of the present invention, each memory cell comprises four terminals. They are, namely, the drain, the first control gate, the second control gate, and the source. The memory cells are generally arranged in a matrix of rows and columns within the sub-array.

The above mentioned sub-arrays can be layouted in a variety of configurations. In one configuration, the memory cells are layouted as a mirror image as their counterparts in the adjacent column. Such a configuration is called the non-switched ground circuit. In another configuration, memory cells in each column of the sub-arrays are layouted substantially the same as their counterparts in the adjacent column. Such an embodiment is called the switched ground circuit. For both embodiments, within each of the sub-array, drain terminals of the memory cells in a column of the matrix are connected together to form bitlines. First control gate terminals of the memory cells in a row of the matrix are connected together to form X-control lines. Second control gate terminals of the memory cells in a column of the matrix are connected together to form Y-control lines. Moreover, source terminals of the memory cells in a column are connected together to form sourcelines. However, in the switched ground circuit, the bitlines and the sourcelines are indistinguishable from one other, and they can be switched for either purposes by the connection transistors.

Based on the aforementioned sub-arrays as basic building blocks. Different novel memory circuits can be arranged.

In a first embodiment of the present invention, the memory circuit is a one-bit wide structure in which each memory cell in the entire memory array can be addressed randomly and swiftly.

In a second embodiment of the present invention, the memory circuit is organized as a multi-bit-wide memory array in which the memory cells are addressed on multiple-bit basis at a time.

In a third embodiment of the invention, the memory circuit is also structured as a multi-bit-wide array and is specifically designed for EPROM or EEPROM in which there is an inherent disparity between the programming time and the reading time. The unique design of this embodiment allows data to be cumulatively read into a temporary storage circuit within a predetermined time period, while at the same time, allows the cumulative data stored in the previous time period to be programmed into the memory cell array. Idle time is curtailed down to a minimum, resulting in a non-volatile memory circuit capable of achieving the programming time as fast as the reading time.

These and other features and advantages of the invention will be more apparent to those skilled in the art from the following detailed description, taken together with the accompanying drawings, in which like reference numerals refer to like parts.

DETAILED DESCRIPTION OF THE INVENTION

Figure 1A:
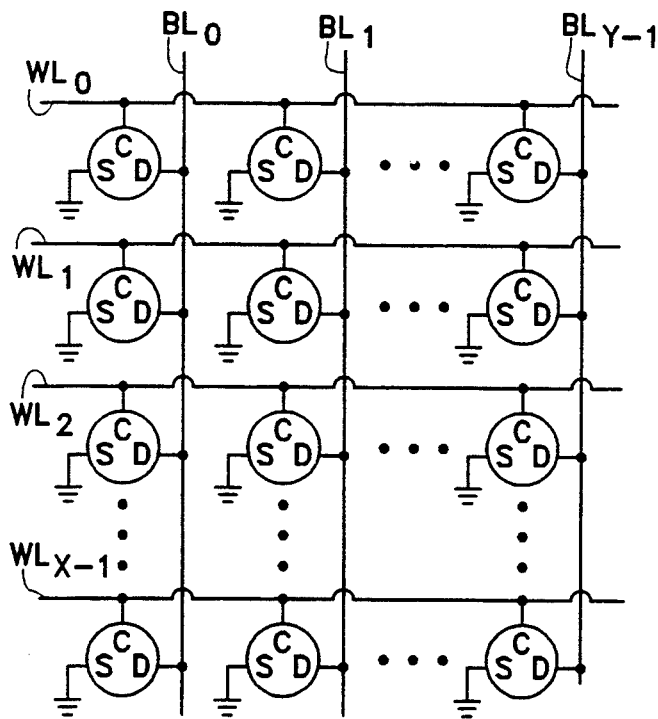
FIG. 1a is a partial schematic drawing of a prior art memory circuit with storage elements having three terminals.
Figure 1B:
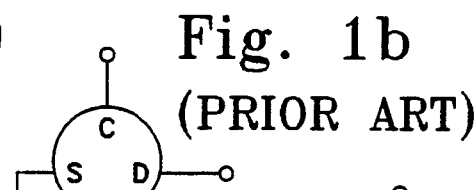
FIG. 1b is a general schematic drawing for prior art memory cell having three terminals.
Figure 1C:
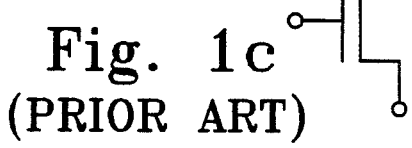
FIG. 1c is a schematic drawing of a prior art ROM cell with three terminals.
Figure 1D:
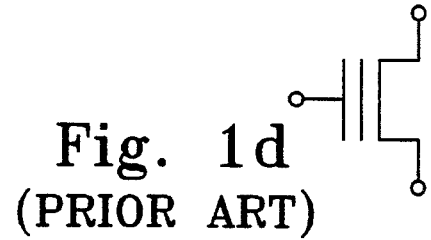
FIG. 1d is a schematic drawing of a prior art EPROM or EEPROM cell with three terminals.
Figure 2:
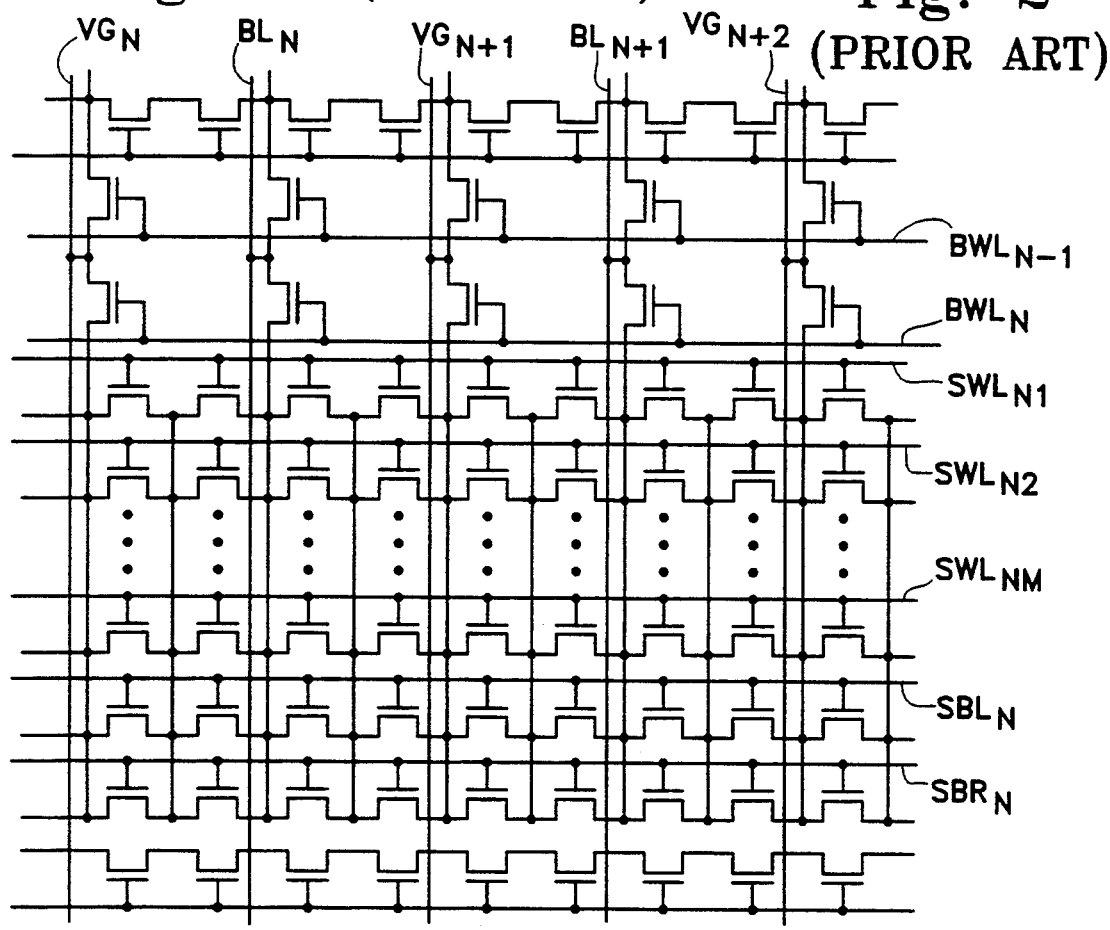
FIG. 2 is a partial schematic drawing of another prior art memory circuit with three-terminal memory cells, in which the memory address lines are partitioned into three groups.
Figure 3:
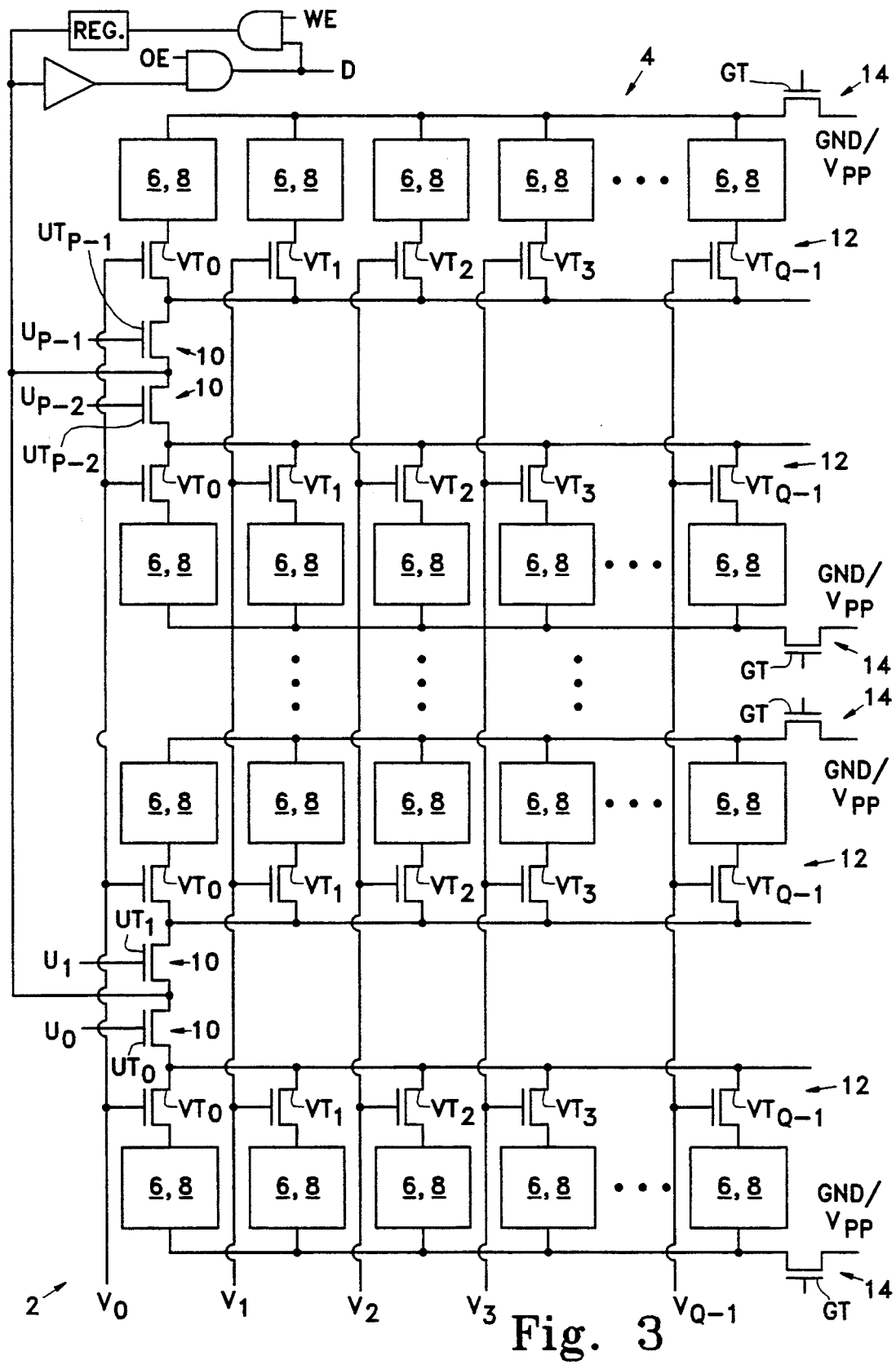
FIG. 3 is a partial schematic drawing of the memory circuit of a first embodiment of the present invention having the main memory array partitioned into a plurality of sub-arrays.

Reference is now made to FIG. 3 which shows a one-bit-wide memory circuit 2 having a main memory array generally designated by reference numeral 4. Main array 4 comprises a plurality of sub-arrays 6 or 8, in which sub-arrays 6 and 8 are designated as the sub-arrays of the non-switched ground circuit and the switched ground circuit, respectively. Sub-arrays 6 or 8 comprise a plurality of memory cells with internal structures as shown respectively in FIG. 5 and FIG. 6. The structures and the operational details of sub-array 6 and 8 will be described later.

The main array 4 shown in FIG. 3 is illustrated as arranged in a matrix of sub-arrays with P rows and Q columns. There are also P row address lines $U_0, U_1, U_2, \ldots U_{P-1}$, which are in turn used to control the row addressing circuit 10. In this embodiment, row addressing circuit 10 comprises MOSFETs labeled $UT_0, UT_1, UT_2, \ldots UT_{P-1}$. Similarly, there are Q column address lines $V_0, V_1, V_2, \ldots V_{Q-1}$, which are in turn used to control the column addressing circuit 12. In this embodiment, column addressing circuit 12 comprises MOSFETs labeled as $VT_0, VT_1, VT_2, \ldots VT_{Q-1}$. Traversing each of the sub-arrays 6 or 8 are also R X-address lines $X_0, X_1, X_2, \ldots X_{R-1}$, and S Y-address lines $Y_0, Y_1, Y_2, \ldots Y_{S-1}$. These R X-address lines and S Y-address lines are not shown FIG. 3 for the sake of clarity, but they are clearly shown in FIGS. 5 and 6. It here should be noted that the total number of memory cells in the main memory array 4 is the mathematical product of P, Q, R, and S. Moreover, each of the memory cells in the main array 4 is individually addressable by the simultaneous energization of four of the N address lines, in which one line is selected from each of the four line groups P, Q, R, and S.

Figure 4A:
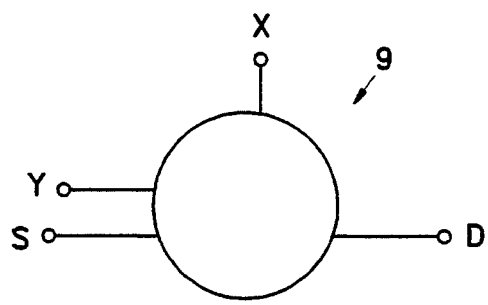
FIG. 4a is a schematic drawing of a four-terminal memory cell in general.
Figure 4B:
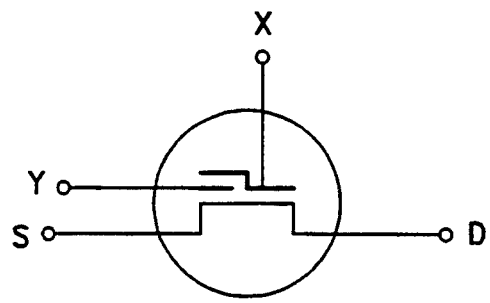
FIG. 4b is a schematic drawing of a four-terminal ROM cell.
Figure 4C:
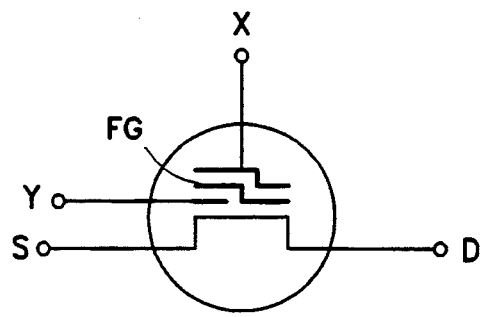
FIG. 4c is a schematic drawing of a four-terminal EPROM cell.
Figure 4E:
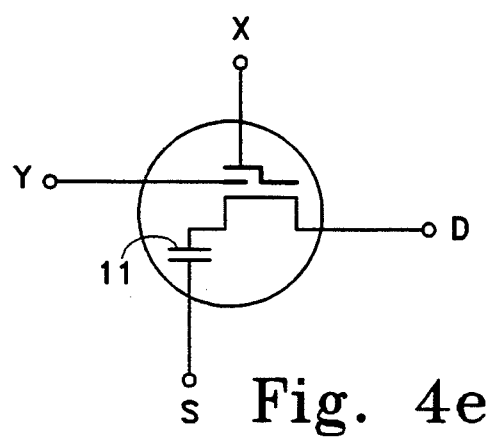
FIG. 4e is a schematic drawing of a four-terminal DRAM cell.
Figure 4D:
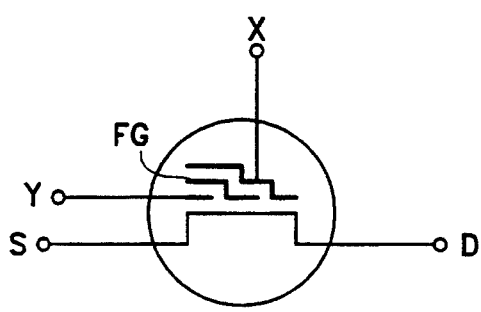
FIG. 4d is a schematic drawing of another four-terminal EEPROM cell.
Figure 4F:
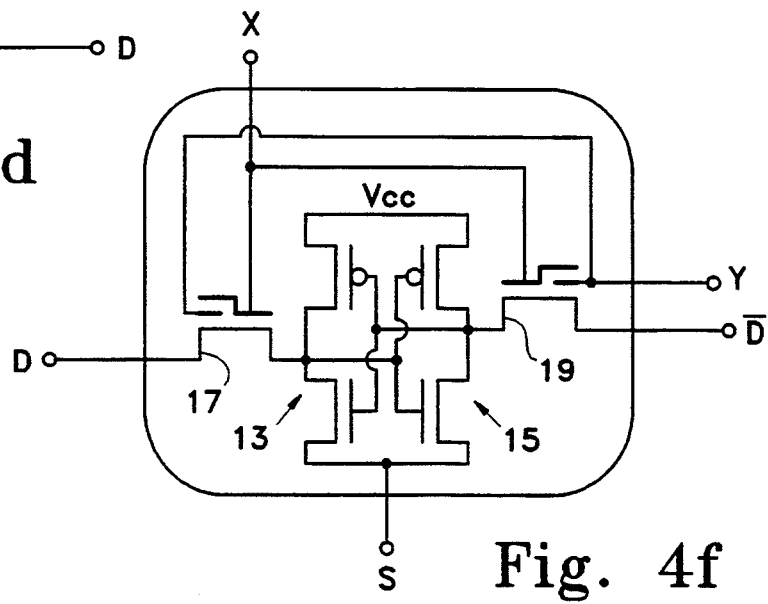
FIG. 4f is a schematic drawing of a four-terminal SRAM cell.

Memory circuits of the present invention are especially suitable to be used with memory cells having four terminals. Examples of such memory cells are shown in FIGS. 4a–4f. FIG. 4a is a general schematic representation of a four-terminal memory cell 9 with a drain terminal D, a source terminal S, and two control gate terminals, namely, a first control gate X and a second control gate Y. FIG. 4b is a schematic of a four-terminal ROM cell in which the threshold voltages of the MOSFET transistor of the ROM cell is preprogrammed with different levels to represent the logical bits "1" and "0". FIGS. 4c and 4d show memory cells with floating gates FG as charge storage elements. Each floating gate FG can be activated by the simultaneous energization of both the first control gate X and the second control gate Y. FIG. 4c is a schematic of a memory cell of a EPROM circuit, while FIG. 4d is another schematic of a memory cell of a flash EEPROM circuit. FIG. 4e is a schematic representation of a DRAM cell having a parasitic or individual capacitor 11 as a storage element. Each of the control gates X and Y overlies a portion of the channel the MOSFET. Addressing of the DRAM cell includes the simultaneous energization of both the control gates X and Y. FIG. 4f is a schematic drawing of a SRAM cell. Inside the SRAM are two cross-coupled invertor gates 13 and 15 which constitute a bi-stable circuit as a basis for informational storage. The are also two peripheral transistors 17 and 19 electrically attached to invertor gates 13 and 15, respectively. Again, access of the SRAM cell is directed through the peripheral transistors 17 and 19 which are in turn capable of being turned on by the simultaneous energization of both control gates X and Y. The drain terminal D of the SRAM cell is sometimes called data terminal. Notice that there is an optional D' terminal, called the complementary data terminal, incorporated in the SRAM cell. The D' terminal can be eliminated if another invertor gate is included within the SRAM cell.

The structure of the each of sub-arrays 6 or 8 shown in FIG. 3 can assume various configurations. Two exemplary configurations are herein described.

Figure 5:
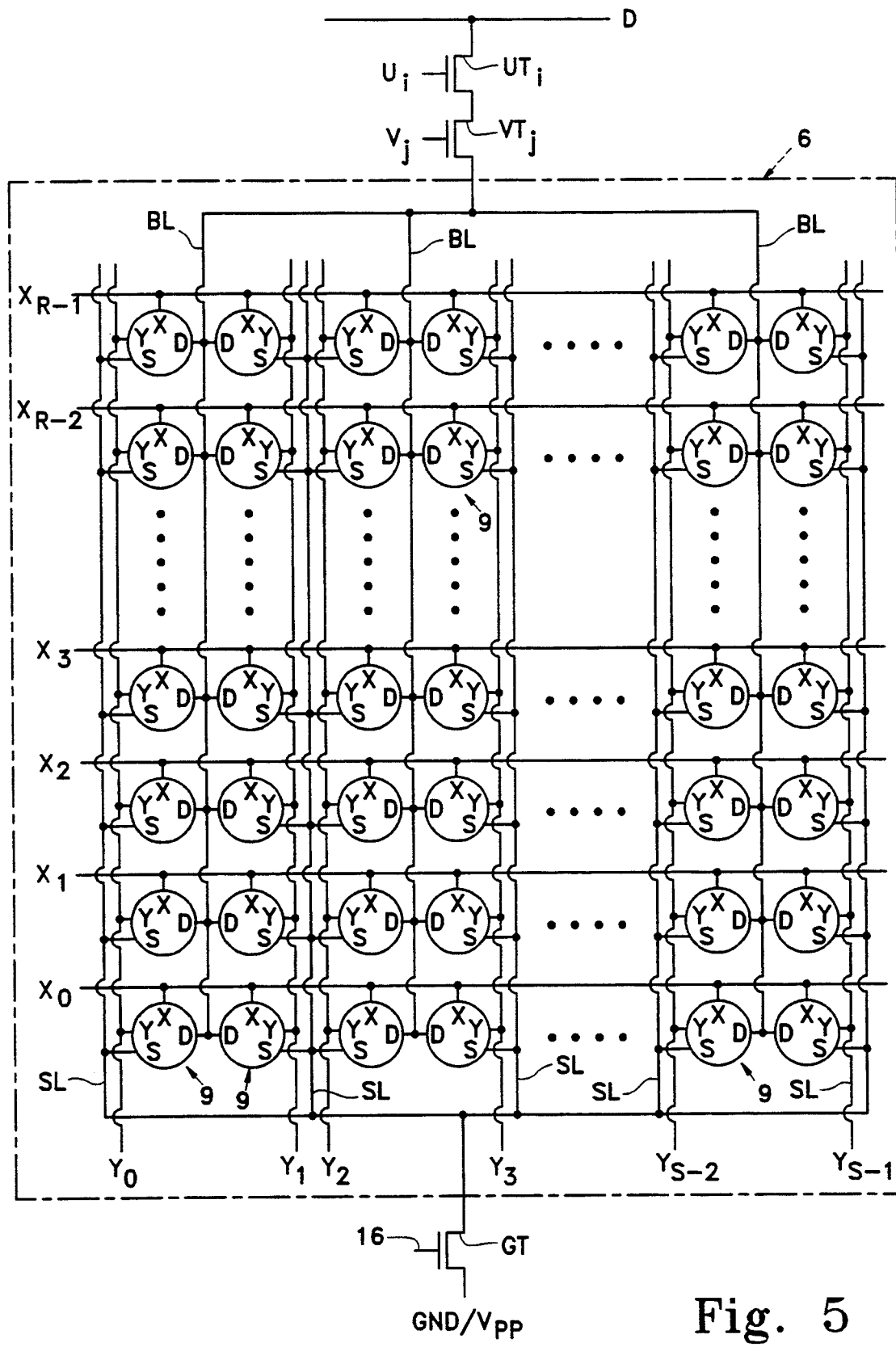
FIG. 5 is a schematic drawing of a first configuration of a sub-array of the memory circuit shown in FIG. 3, called the non-switched ground circuit, in which memory cells in each column of the sub-arrays are layouted as a mirror image as their counterparts in the adjacent column.

FIG. 5 shows a sub-array of a non-switched ground circuit. The sub-array is designated by reference numeral 6, in which the memory cells are arranged in a matrix of R rows and S columns. As is shown, the drain terminals D of all the memory cells in a column are connected together to form bitlines BL. The first control gates X of all the memory cells in a row are connected together to form X-address lines $X_0, X_1, X_2, \ldots X_{R-1}$. In a similar manner, the second control gates Y of all the memory cells in a column are connected together to form Y-address lines $Y_0, Y_1, Y_2, \ldots, Y_{S-1}$. Moreover, the sources S of all the memory cells in a column are connected together to form source lines SL.

A MOSFET $UT_i$ ($0 \leq i \leq P-1$), external to sub-array 6 and is a part of row addressing circuit 10 (FIG. 3.), is controlled by one of the P row address lines $U_i$ ($0 \leq i \leq P-1$). Similarly, another MOSFET $VT_j$ ($0 \leq j \leq Q-1$), external to sub-array 6 and is a part of column addressing circuit 12 (FIG. 3.), is controlled by one of the Q column address lines $V_j$ ($0 \leq j \leq Q-1$). The simultaneous energization of both MOSFETs $UT_i$ and $VT_j$ allows the addressing of sub-array 6 in the ith row and the jth column of main memory array 4 (FIG. 3).

There is also a third MOSFET GT, external to sub-array 6, and is a part of the potential supply circuit 14 (FIG. 3), electrically connected to source lines SL. MOSFET GT is used for switching either the ground potential or the programming potentials to source lines SL, depending on the modes of operation of sub-array 6 such as programming, deprogramming, or reading. MOSFET GT can be controlled by tieing the gate terminal 16 to the power supply terminal, the row address line $U_i$, the column address line $V_j$, or to the output of a logical circuit which generates the logical AND function of the row and column address lines $U_i$ and $V_j$. It should be noted that in sub-array 6 of the non-switched ground circuit, memory cells in each of the S columns are layouted as a mirror image to their counterparts in the adjacent column.

Figure 6:
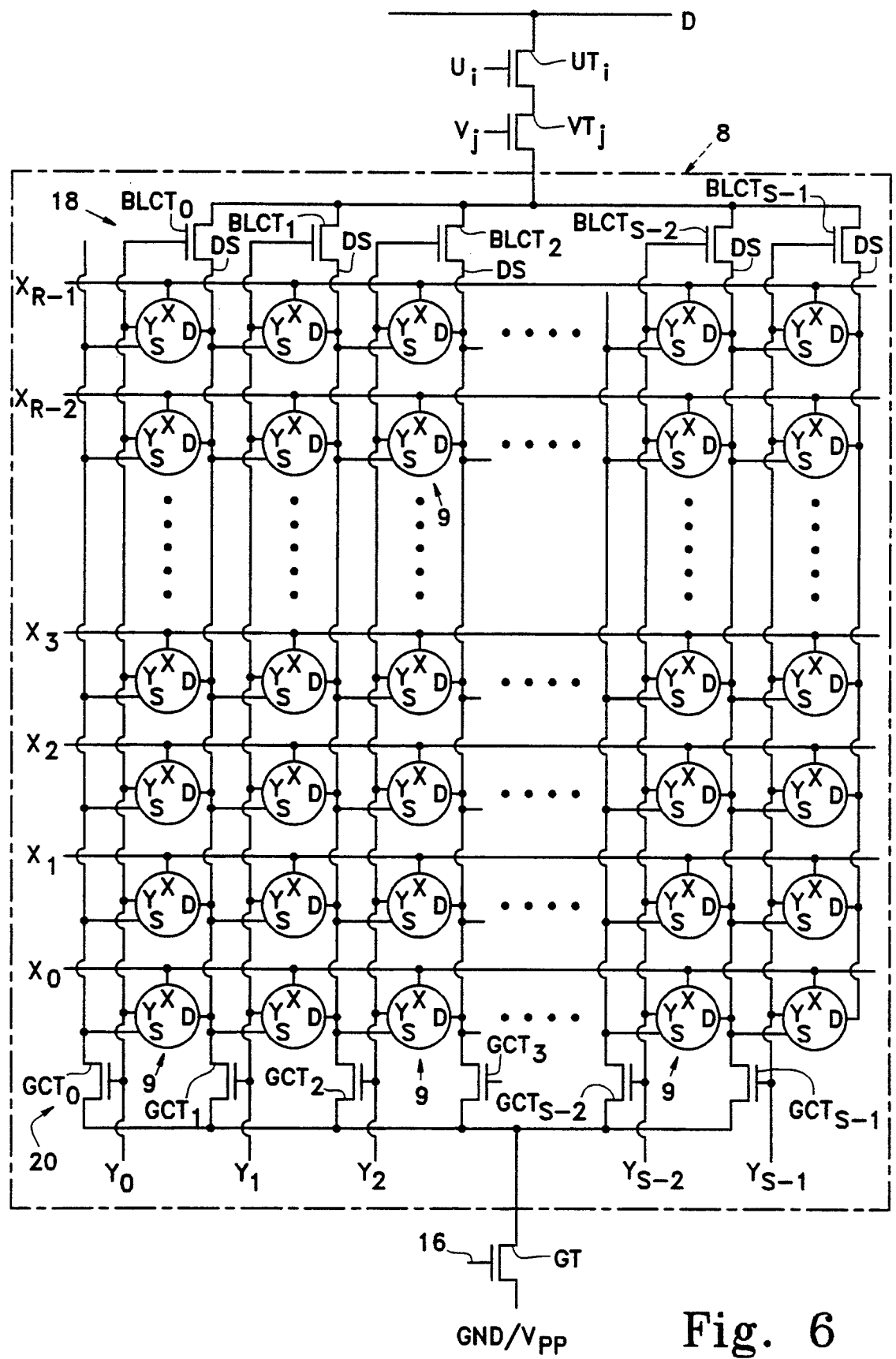
FIG. 6 is a schematic drawing of a second configuration of a sub-array of the memory circuit shown in FIG. 3, called the switched ground circuit, in which memory cells of each column of the sub-arrays are layouted substantially the same as their counterparts in the adjacent column.

FIG. 6 shows a sub-array of a switched ground circuit. There are a number of similarities in sub-array 8 as compared to sub-array 6 shown in FIG. 5. For the sake of a clear and concise illustration, only the differences are highlighted.

As is different from sub-array 6 shown in FIG. 5, memory cells in each of the column in sub-array 8 are layouted substantially the same as their counterparts in the adjacent columns. Moreover, in each of the memory cells in a column, there is a first connection circuit 18 having a MOSFET BLCT (Bit Line Connection Transistor) electrically connected between MOSFET $VT_j$ and the connected drains of all the memory cells in a column. In a similar manner, there is a second connection circuit 20 having another MOSFET GCT (Ground Connection Transistor) electrically connected between MOSFET GT and the sources of all the memory cells in a column. Both MOSFETs BLCT and GCT are controlled by the Y-address lines, $Y_0, Y_1, Y_2, \ldots Y_{S-1}$. The common lines labelled as DS can be used either as bitlines or as ground lines, depending on which column address line is energized. Due to the dual roles played by common line DS, the term "switched ground" is therefore derived. The advantage of implementing sub-arrays with the switched ground feature is mostly economical. Sub-arrays with the switched ground feature are more tolerant to mask mis-alignments during the fabrication process, in comparison to sub-arrays with the non-switched ground features such as sub-arrays 6 shown in FIG. 5. Therefore higher fabrication yield can be accomplished, but at the expense of extra circuit complexity.

The operational details of both switched and non-switched ground circuits are herein described. Both types of memory circuits are capable of programming, deprogramming, and reading. For instance, during the read operation, the sub-array in the ith row and the jth column of the maim memory array 4 (FIG. 3) needs to be selected by turning MOSFETs $UT_i$ and $VT_j$ on. With MOSFETs $UT_i$ and $VT_j$ turned on, bitlines BL of the selected sub-array 6, or common line DS of the selected sub-array 8, are energized to +2 Volts. Simultaneously, the selected X-address line $X_m$ ($0 \leq m \leq R-1$) and the selected Y-address line $Y_n$ ($0 \leq n \leq S-1$) are energized to +3 Volts. As a result, memory cell in the mth row and the nth column of sub-array 6 is addressed. Depending on the threshold voltage previously programmed within the MOSFET in the addressed memory cell, there will be a presence or an absence of current flowing through the bitline BL or common line DS to data terminal D, which is then fed to a sense amplifier (not shown). For example, if the threshold voltage of the MOSFET in the addressed memory cell is previously programmed with a +5 Volts value, no current can flow to data terminal D, and the logic bit "0" is read. Conversely, if the threshold voltage of the MOSFET in the addressed memory cell is previously programmed with a +1 Volt value, current flows to data terminal D, and the logical bit "1" is read, for instance. The memory cell as was mentioned can be a memory cell of either a DRAM, SRAM, ROM, EPROM, EEPROM, or flash EEPROM circuit. With the exception of ROM, all the memory cells are programmable and deprogrammable. In the case of ROM, the threshold voltages of the MOSFETs in each of the memory cells are preprogrammed with a predefined code during the fabrication process.

Programming can be performed electrically for EPROM, EEPROM, SRAM and DRAM. However, deprogramming for EPROM normally involves the illumination of Ultra Violet (UV) light through a quartz window in the integrated circuit package. Deprogramming for EEPROM is normally performed simultaneously on a plurality of memory cells, either on a sub-array basis, on a sector basis, or on a entire main array basis. Deprogramming of SRAM and DRAM are normally conducted randomly and simultaneously with the programming process in which old data are overridden by the new data in the selected memory cell.

Reference is now directed back to FIGS. 5 and 6. For the sake of a concise illustration. The operational mechanisms of non-volatile memory circuits, such as EPROM or EEPROM, are described herein. It should be appreciated that the operational details for volatile memory circuits, such as SRAM and DRAM are substantially similar.

Returning now to FIGS. 5 and 6, to begin with, MOSFETs GT of the selected sub-array need to be turned on. This action allows the programming potential Vpp to be supplied to the source lines SL in sub-array 6 shown in FIG. 5. In this case, programming potential Vpp is set at +12 Volts. For the case of switched ground circuit with sub-array 8 as shown in FIG. 6, for programming potential Vpp to be coupled in common lines DS, MOSFETs GCT and BLCT also need to be turned on, in addition to the energization of MOSFET GT. Due to the unique design of the memory cell, such as memory cell 9 shown in FIG. 4d, electrons in floating gates FG jump to the positively charged source regions through a process called the Fowler-Nordheim Tunneling (FNT) effect. As a consequence, floating gates FG in each of the memory cells 9 are depleted with electrons and are therefore positively charges. The positively charged floating gates FG dielectrically attracts electrons in the underlying channels of the MOSFETs in memory cells 9, thereby changing the threshold voltages of the MOSFETs to approximately −2 Volts. Memory cells 9 are said to be deprogrammed.

Programming of memory cell 9 in the mth row ($0 \leq m \leq R-1$) and the nth column ($0 \leq n \leq S-1$) in sub-array 6 shown in FIG. 5 involves the simultaneous energization of bitline BL, X-address line $X_m$, Y-address line $Y_n$, and source line SL to voltage levels of +5 Volts, +12 Volts, +2 Volts, and 0 Volts, respectively. Again, due to the unique design of the memory cell, such as memory cell 9 shown in FIG. 4d, floating gate FG is capacitively coupled with a positive voltage due to the simultaneous energization of both the first control gate X and the second control gate Y of +12 Volts and +2 Volts, respectively. As a consequence, electrons from the underlying channel of the MOSFET in memory cell 9 jump to the floating gate FG, via a process called the Source Side Injection (SSI) effect. Electrons trapped in floating gate FG dielectrically change the threshold voltage of the MOSFET to a +5 Volts. Memory cell 9 in the mth row and the nth column of sub-array 6 is said to be programmed.

For the programming of any memory cell 9 in the mth row ($0 \leq m \leq R-1$) and the nth column ($0 \leq n \leq S-1$) in sub-array 8 shown in FIG. 6, MOSFETs $GCT_n$ and $BLCT_n$ are turned on automatically with the simultaneous energization of the Y-address line $Y_n$. The rest of the programming mechanism is substantially the same as mentioned above.

It should be noted that in both the sub-array 6 shown in FIG. 5 and sub-array 8 shown in FIG. 6, other sets of programming voltages can well be applied. For example, for the programming of memory cell 9 in the mth row ($0 \leq m \leq R-1$) and the nth column ($0 \leq n \leq S-1$) in either the sub-array 6 shown in FIG. 5, or the sub-array 8 shown in FIG. 6, a simultaneous energization of bitline BL, X-address line $X_m$, Y-address line $Y_n$, and source line SL to voltage levels of +7 Volts, +12 Volts, +7 Volts, and 0 Volt, respectively, can be applied. In this case, with higher potential voltage applied to the drains D of memory cell 9, electrons jump to the floating gate FG but is closer to the drain region of each of the memory cells. This phenomena is called the Hot Electron Injection (HEI) effect.

The fabrication of the memory circuits of the present invention is herein briefly described. To begin with, a plurality of parallel diffused regions are formed in a semiconductor substrate to form bitlines BL and sourcelines SL as shown in FIG. 5, or common lines DS as shown in FIG. 6. For the case of ROM, an extra fabrication step has to be performed. The semiconductor substrate needs to be implanted with a pre-defined concentration pattern such that the MOSFETs formed later in the fabrication process will assume different threshold voltages as the pre-defined ROM code. A gate oxide layer is thereafter grown atop the semiconductor substrate. Y-address lines, $Y_0, Y_1, Y_2, \ldots Y_{S-1}$, are formed atop the gate oxide layer by the conventional processes of depositing and etching polysilicon lines parallel to the bitlines BL, or common line DS. Another oxide layer is then grown atop the deposited Y-address lines. For the fabrication of ROM circuits, what follows is the formation of the X-address lines, $X_0, X_1, X_2, \ldots X_{R-1}$, via again the conventional processes of depositing and etching polysilicon lines substantially perpendicular to the column address lines. For the fabrication of EPROM or EEPROM, the step of forming floating gates must be performed first before the step of forming the X-address lines. The forming of floating gates can be achieved with the same conventional techniques of depositing and etching polysilicon as were discussed. It should be noted that other materials can be used as substitutes for the fabrication of the row and column address lines. Examples are refractory silicide or metal. It should also be noted that MOSFETs such UT, VT, GT, BLCT, and GCT are formed simultaneously with the memory cells during the fabrication process. Since the formation of such MOSFETs is well known in the art and is therefore not elaborated further in here. Finally, metal traces are formed atop the semiconductor substrate for the proper electrical connections of the entire memory circuit.

Figure 7:
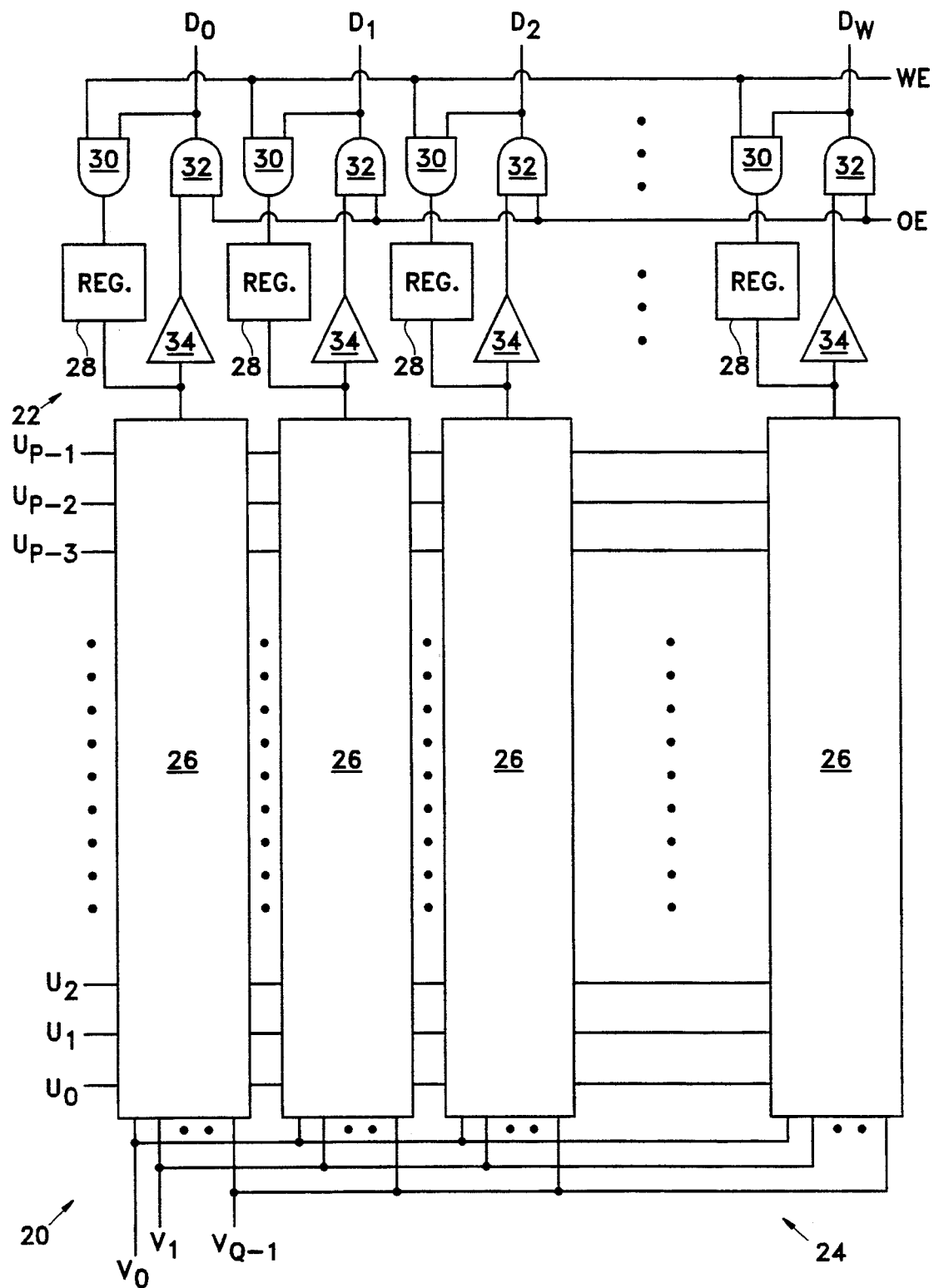
FIG. 7 is partial schematic of a multi-bit-wide memory circuit of a second embodiment of the present invention.

FIG. 7 is a schematic drawing of the second embodiment of the present invention. The memory circuit of this embodiment is generally designated by reference numeral 20 which comprises a data buffer circuit 22 and a main array 24. Memory circuit 20 is a W-bit-wide circuit in which data are written in or read out on a W-bit-wide basis. Main array 24 includes a plurality of memory sectors 26. In this case, the number of memory sectors 26 is W. Each memory sector is substantially the same as main array 4 of memory circuit, shown in FIG. 3. Specifically, memory circuit 2 shown in FIG. 3 is a one-bit-wide memory circuit in which during usage, a plurality of memory circuit 2 must be used in parallel to process data which are normally more than one bit wide. For example, in a digital computational system in which data are organized as a 8-bit-wide format, sometimes called a byte, eight of memory circuits 2 must be used side by side to accomplish the data storage task. In essence, memory circuit 20 shown in FIG. 7 is a plurality integration of memory circuits 2 shown in FIG. 3. However, it should be noted row address lines $U_0, U_1, U_2, \ldots, U_{P-1}$ and column address lines $V_0, V_1, V_2, \ldots, V_{Q-1}$ of the all the memory sectors 26 are correspondingly connected together. In a similar manner, X-address lines $X_0, X_1, X_2, \ldots, X_{R-1}$ and Y-address lines $Y_0, Y_1, Y_2, \ldots, Y_{S-1}$ traversing each of the sub-arrays 6 or 8 in each of the W sectors 26 are also correspondingly connected together.

Figure 8:
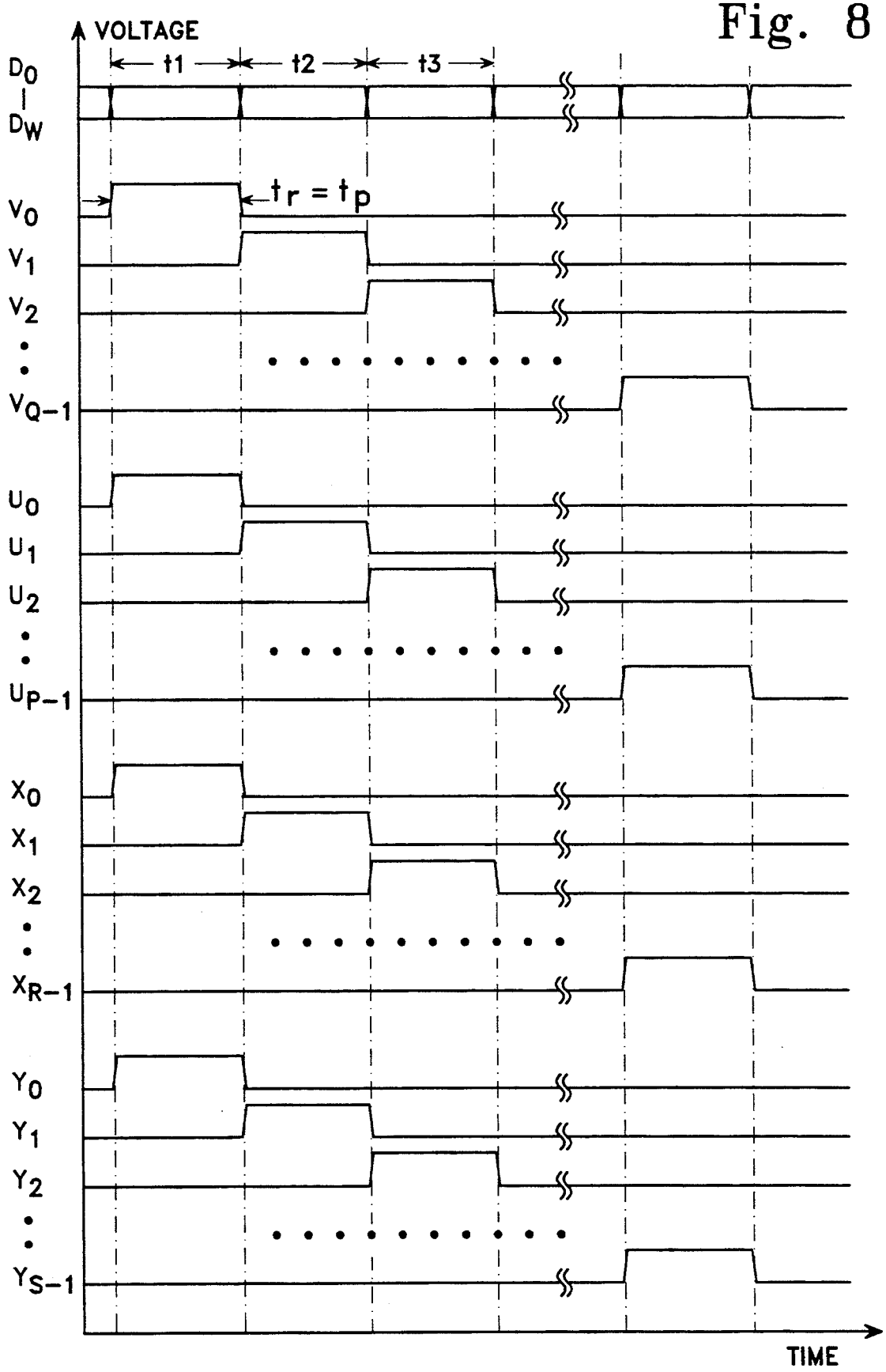
FIG. 8 is a timing diagram showing the programming process of the memory circuit as shown in FIG. 7.

The addressing mechanism of memory circuits 20 is herein described with reference to FIGS. 7 and 8. The functional characteristic of memory circuit 20 is that any memory cell in each of the W memory sectors 26 can be addressed randomly and directly. This is in contrast with many prior art memory circuit in which memory cells in a column of a row must be addressed first and the individual memory cell of the addressed memory row or column is then decoded for programming, deprogramming or reading. For example, a memory cell in the mth row and the nth column in sub-array in the ith row and the jth column in each of the W memory sectors 26 need to be programmed. To begin with, data are first applied at data lines $D_0$-$D_W$. A properly timed write enable WE signal allows the data to be latched into registers 28 through AND gates 30. The selected memory cells can then be programmed immediately by the simulations energization of 4 address lines, namely, the row address lines $U_i$, column address line $V_j$, X-address lines $X_m$, and Y-address lines $Y_n$. Any other memory cells can be programmed in a similar manner. The timing diagram shown in FIG. 8 illustrates the programming of memory circuit 20 in a somewhat randomly programming pattern. For instance, during the time period t1, memory cell in the 0th row and the 0th column of the sub-array in the 0th row and the 0th column of each of the memory sectors 26 is programmed. During the time period t2, memory cell in the 1st row and the 1st column of sub-array in the 1st row and the 1st column of each of the sectors 26 is programmed.

It should be noted that in this embodiment, the time for data to be read into registers 28, denoted as $t_r$, also approximately equals the time the data is programmed into the memory array 24, denoted as $t_p$. For volatile memory circuits, at the current state of the technology, $t_r$ and $t_p$ are comparably equal in magnitude and therefore the programming process does not involve much idle time. A memory circuit with optimal timing can thus be designed. However, the scenario is different with regard to non-volatile memory circuits. It is well known in the art that programming time $t_p$ is at least an order of magnitude slower than the reading time $t_r$. The reason is because non-volatile memory circuits utilize floating gates for trapping or repelling charged carriers via the Fowler Norheim tunneling (FNT) effect or various electron injection effects, which is relatively slow in comparison to the normal switching speed of transistors. As a consequence, when programming memory cells of the non-volatile type, considerable idle time is involved if data loading and data programming are executed alternatively with the memory array.

Figure 9:
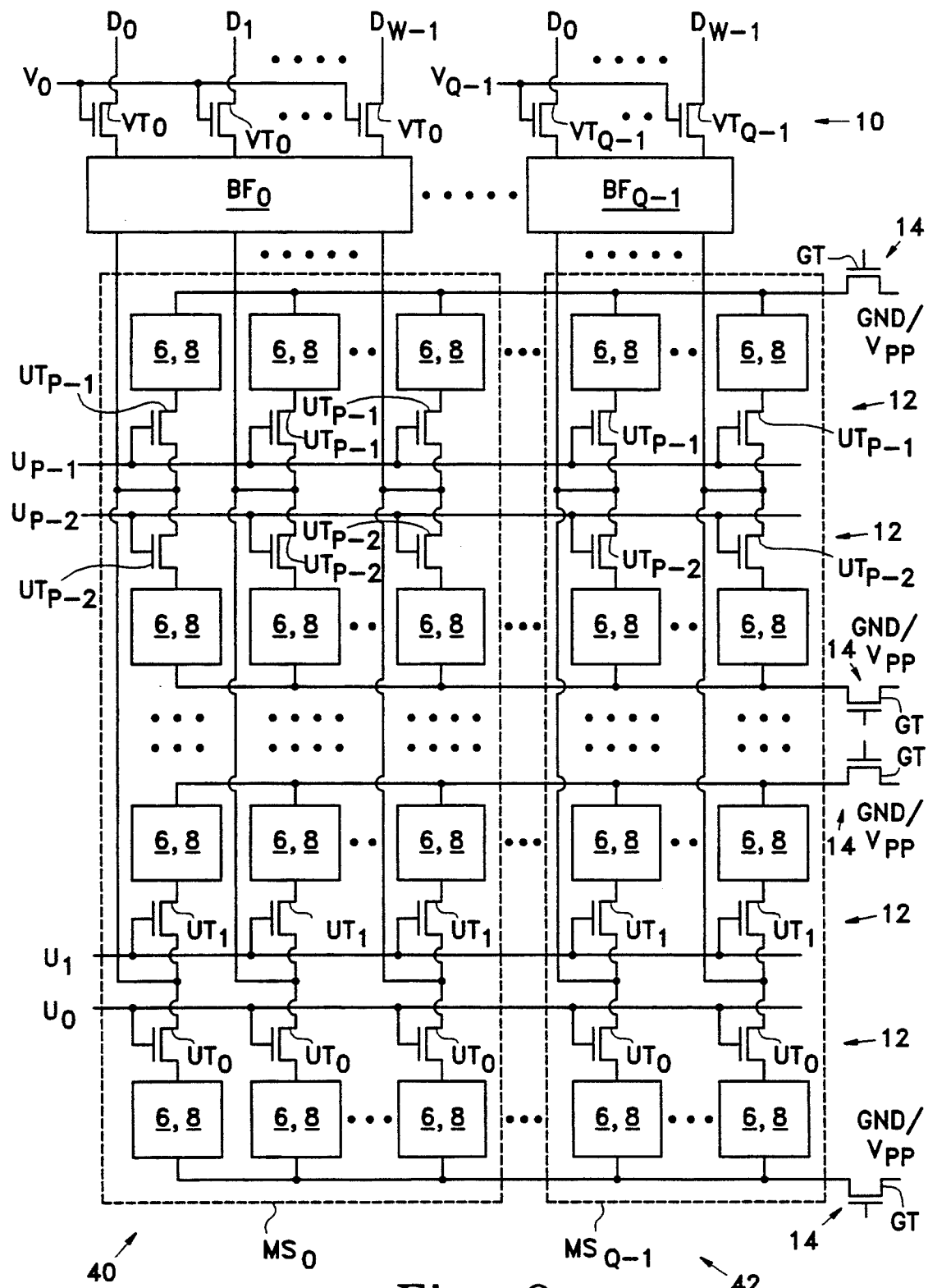
FIG. 9 is partial schematic of a multi-bit-wide memory circuit of a third embodiment of the present invention.

FIG. 9 is a schematic drawing of a third embodiment of the present invention generally designated by reference numeral 40. Memory circuit 40 is designed to bypass the aforementioned shortfalls. Memory circuit 40 is specifically suitable for memory cells in which programming time $t_p$ is inherently much slower than the data reading time $t_r$. This restriction still applies to most non-volatile memory cells commonly available. The main characteristic of this embodiment is that data are cumulatively read in the temporary storage registers during a predetermined time period, and simultaneously, cumulative data stored from a previous predetermined time period are programmed into the main array.

Figure 10:
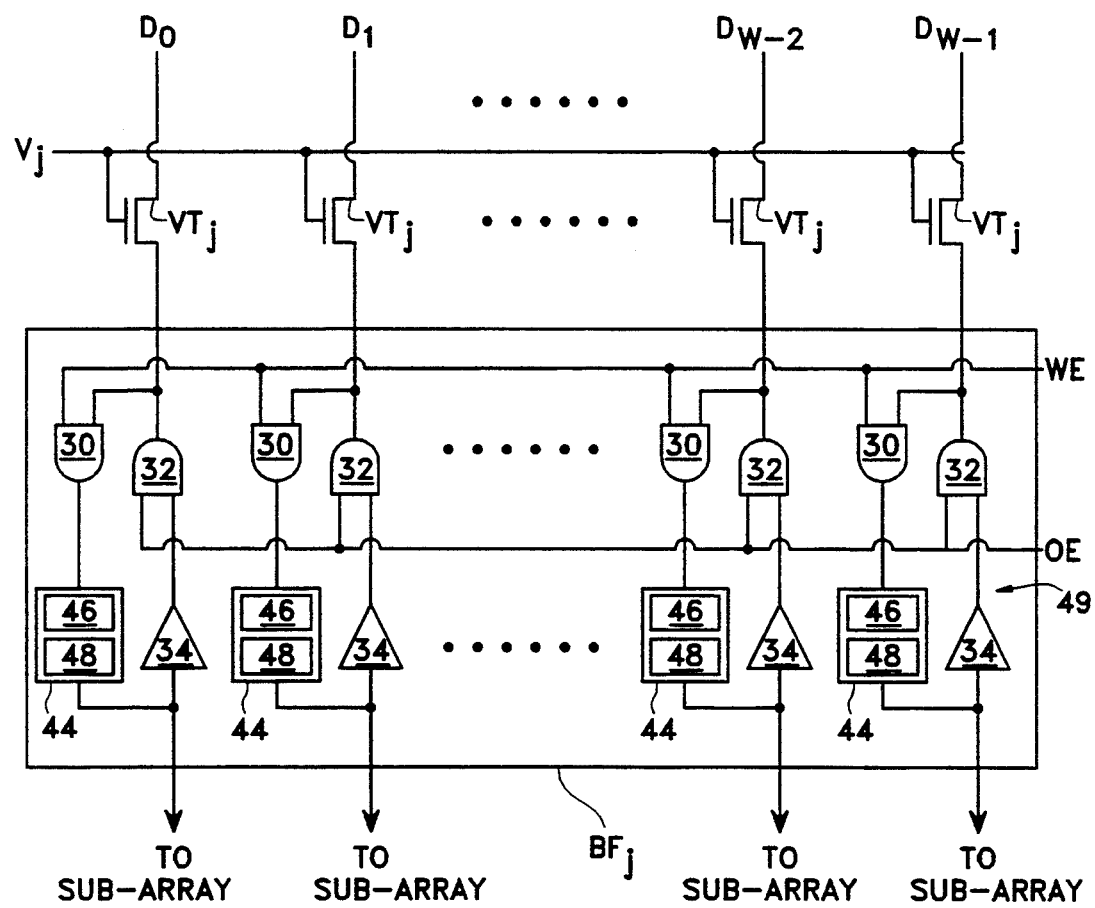
FIG. 10 is a schematic drawing of one of the data buffering circuits of the memory circuit shown in FIG. 9.

As shown in FIG. 9, memory circuit 40 is W-bit-wide having W data lines $D_0$-$D_{W-1}$. There are also Q data buffering circuits $BF_0$-$BF_{Q-1}$ with each connected to the W data lines. Disposed between the W data lines $D_0$-$D_W$ and each of the Q data buffering circuits $BF_0$-$BF_{Q-1}$ are column addressing circuit 10. In this embodiment, column addressing circuit 10 comprises a plurality of MOSFETs $VT_0$-$VT_{Q-1}$ controlled by column address lines $V_0$-$V_{Q-1}$. The internal construction of each of data buffering circuits $BF_0$-$BF_{Q-1}$ are substantially the same as each other. An exemplary data buffering circuit in the jth column $(0<j<Q)$ $BF_j$ is shown in FIG. 10. Date buffering circuits $BF_0$-$BF_{Q-1}$ of this embodiment is substantially the same as the previous embodiment and need no further elaborations in here. However, each of the W registers 44 in register circuit 49 needs to be a bi-level register. Specifically, register 44 comprises a master circuit portion 46 and a slave circuit portion 48, such that data can be gated into the master circuit portion 46 during a first portion of a clock period, shifted to the slave circuit portion 48 during a second portion of the same clock period. Examples for such bi-level registers are masterslave flip-flops, or other flip-flops or latches connected side-by-side together. The role of register circuit 49 will be described later.

Reference is now directed to the main array 42 shown in FIG. 9. Main array 42 includes a plurality of memory sectors. In this case, there are Q memory sectors $MS_0$–$MS_{Q-1}$, with each having a plurality of sub-arrays 6 or 8 as shown in FIGS. 5 and 6, respectively. Specifically, sub-arrays 6 or 8 in each of sectors $MS_0$–$MS_{Q-1}$ are arranged in a matrix format with P rows and W columns. Connected to each of the sub-arrays in a row in each of the Q sectors is a row addressing circuit 12 comprising a plurality of MOSFETs $U_0$–$U_{P-1}$ controlled by row address lines $U_0$–$U_{P-1}$.

Figure 11:
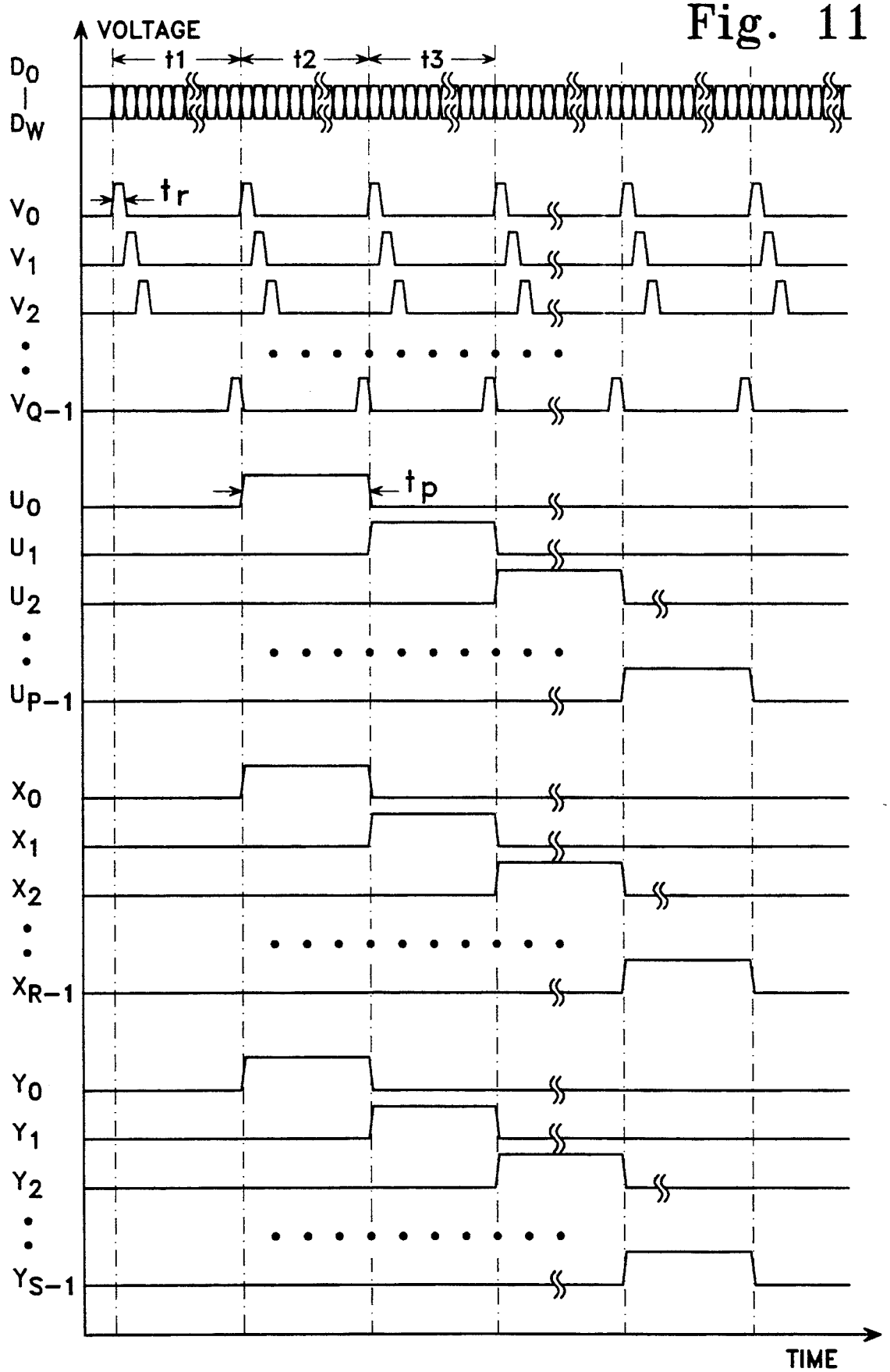
FIG. 11 is a timing diagram showing the programming process of the memory circuit as shown in FIG. 9.

The operational mechanism of memory circuit 40 can best be understood with reference to FIGS. 9-11. In general, to program memory circuit 40, data are first accumulatively loaded into data buffering circuits $BF_0$–$BF_{Q-1}$. Thereafter, the accumulated data are simultaneously programmed into the main array 42. The data loading and programming processes are executed concurrently. There is minimal idle time involved and memory circuit 40 can be programmed as fast as it is being read. A specific example may illustrate this point further.

To program memory circuit 40, data are first presented at the data line and are then sequentially loaded into the master circuit portions 46 of registers 44 in each of Q data buffering circuits $BF_0$–$BF_{Q-1}$. This is all accomplished by energizing the column address lines $V_0$–$V_{Q-1}$ sequentially within a time period t1 as shown in FIG. 11. Also within time period t1, the time associated with loading each of the register circuit 49 in each of the Q data buffering circuits $BF_0$–$BF_{Q-1}$ must be at least as long as the time period illustrated as $t_r$ shown in FIG. 11. Time period $t_r$ is defined as the minimal time for each register 44 to be reliably loaded with the desired datum. Also happening within the same time period t1, in all the registers 44, data loaded into the master circuit portions 46 are automatically sunk into the slave circuit portions 48 and avails the master circuit portions 46 to accept new data. With all the registers in the Q data buffering circuits $BF_0$–$BF_{Q-1}$ fully loaded in slave circuit portions 48, at the onset of time period t2, column address line $U_0$, X-address line $X_0$, and Y-address line $Y_0$ are all simultaneously energized. The duration of energization must last at least as long as time period illustrated as $t_p$ shown in FIG. 11. $t_p$ is defined as the minimal programming time for each memory cell to be reliably programmed. The result is that Q memory cells are programmed into main array 42. Each of these Q memory cells is located in the 0th row and the 0th column of the sub-array in the 0th row and the 0th column of each of the memory sectors $MS_0$–$MS_{Q-1}$. While the aforementioned process in progress, the master circuit portions 46 of each of the W registers 44 in each of the Q data buffering circuits $BF_0$–$BF_{Q-1}$ are accepting other data during the same time period t2. At the onset of time t3, column address line $U_1$, X-address line $X_1$, and Y-address line $Y_1$ are simultaneously energized. As a consequence, another Q memory cells are programmed in main array 42. This time, each of these Q memory cells is located in the 1st row and the 1st column of the sub-array in the 1st row and the 1st column of each of the memory sectors $MS_0$–$MS_{Q-1}$. The aforementioned process repeats itself until all the memory cells in main array 42 are programmed.

It should be noted that the programming timing for memory circuit 40 is most optimally designed when the following mathematical equation is satisfied:

$$Q \times t_r = t_p$$

where the parameters Q, $t_r$ and $t_p$ are all defined as above. Phrased differently, when the data reading time $t_r$ into the Q data buffering circuits $BF_0$–$BF_{Q-1}$ equals the minimal required programming time $t_p$ of each memory cell, there will be no idle time wasted. Memory circuit 40 can have the register circuits 49 cumulatively loaded with data, and have the memory sectors $MS_0$–$MS_{Q-1}$ concurrently programmed at the same time. The result is that data programming time can be as fast as the data reading time for memory circuit 40.

For the reading of memory circuit 40, any memory cell in each of the memory sectors $MS_0$–$MS_{Q-1}$ can be addressed by the simultaneous energization of four address lines selected from each of the row address lines $U_0$–$U_{P-1}$, column address lines $V_0$–$V_{Q-1}$, X-address line $X_0$–$X_{R-1}$, and Y-address line $Y_0$–$Y_{S-1}$. As an illustration, suppose memory cells in the mth ($0<m<R$) row and the nth ($0<n<S$) column in sub-array in the ith ($0<i<P$) row and the jth ($0<j<Q$) of all the Q memory sectors need to be read. Row address line $U_i$, column address lines $V_j$, X-address line $X_m$, and Y-address line $Y_m$ need to be simultaneously energized. Depending on the pre-programmed threshold voltage of the MOSFET in the selected memory cell, the channel of the MOSFET is either conducting or non-conducting. This information is fed into sense amplifier 34 and then gated to AND gate 32 upon the energization of output enable OE control line (FIG. 10). Since column address signals $V_0$–$V_{Q-1}$ are energized, all the MOSFETs $VT_0$–$VT_{Q-1}$ are turned on (FIG. 9). As a result, the read-out data are available at data lines $D_0$–$D_W$.

The present invention being thus described, it will be understood by those skilled in the art that other changes in form and detail may be made therein. The description of the preferred embodiments is not to be exhaustive or limited to the forms disclosed. Various modifications for various embodiments are intended to be included within scope of the following claims.

What is claimed is:

1. A memory array having a plurality of memory cells in which each of the memory cells in the memory array includes a first and a second control gate, such that a simultaneous energization of the first and second control gates enables the addressing of each of the memory cells, said memory array comprising:

a plurality of sub-arrays, each of said sub-arrays includes a plurality of memory cells arranged in a matrix of rows and columns, with the first control gate of each of the memory cells in a row being electrically connected, thereby forming a plurality of X-address lines, and with the second control gate of each of the memory cells in a column being electrically connected together, thereby forming a plurality of Y-address lines;

a plurality of row address lines; and a plurality of column address lines, said plurality of row and column address lines being operatively connected to said sub-arrays such that a simultaneous energization of a pair of address lines selected from each of said row and column address lines enables the selective addressing one of said sub-arrays;

wherein the addressing of a selected memory cell in the memory array comprises the simultaneous energization of a selected pair of said row and column address lines for the selective addressing of one of said sub-arrays, and further comprises the simultaneous energization of a selected pair of said X-address and Y-address lines for the selective addressing of said selected memory cell in said selected sub-array.

2. The memory array as set forth in claim 1 further comprising a potential supply circuit electrically connected to each of said sub-arrays such that when said selected memory cell is addressed, said potential supply circuit provides predetermined voltage potentials to said selected memory cell for the programming, deprogramming and reading.

3. The memory array as set forth in claim 1 further comprising a row addressing circuit electrically disposed between said sub-arrays and said plurality of row address lines, and a column addressing circuit electrically disposed between said sub-arrays and said plurality of column address lines, said row and column addressing circuits being controlled by said row and column address lines, respectively.

4. The memory array as set forth in claim 3 further comprising a plurality of register circuits electrically disposed between said column addressing circuit and said plurality of sub-arrays, such that during programming, data are cumulatively stored in said plurality of register circuits by the said column addressing circuit in response to the energization of said column address lines before being programmed in said sub-arrays.

5. The memory array as set forth in claim 4 wherein each of said plurality of register circuits comprises a plurality of master and slave circuit portions, wherein during programming data are cumulatively stored in said master circuit portions and transferred to said slave circuit portions within a first predetermined time period, thereby enabling the data in said slave circuit portions to be programmed in said sub-arrays during a second predetermined time period, and simultaneously allowing other data to be cumulatively stored in said master circuit portions during said second predetermined time period.

6. The memory array as set forth in claim 1 wherein the memory cells in each of the columns are disposed in a semiconductor substrate as a mirror image of an adjacent column in each of said sub-arrays.

7. The memory array as set forth in claim 2 wherein the memory cells in each of the columns are disposed in a semiconductor substrate substantially the same as an adjacent column in each of said sub-arrays.

8. The memory array as set forth in claim 7 wherein each of said memory cells further comprising a source and a drain, and wherein the source and the drain of a memory cell in each of the columns in each of said sub-arrays are electrically connected to a first and a second connection circuit, respectively, said first and second connection circuits being controlled by a corresponding Y-address line connected to said memory cell such that when said Y-address line is energized, the memory cells in the column energized by said Y-address line are operatively connected to said potential supply circuit.

9. The memory array as set forth in claim 1 wherein a row addressing circuit, column addressing circuit, and potential supply circuit comprise metal oxide semiconductor field effect transistors.

10. The memory array as set forth in claim 1 wherein said X-address and said Y-address lines comprise polysilicon.

11. The memory array as set forth in claim 1 wherein said X-address and said Y-address lines comprise refractory silicide.

12. The memory array as set forth in claim 1 wherein said X-address and said Y-address lines comprise metal.

13. The memory array as set forth in claim 1 wherein each of said memory cells further comprising a source and a drain, and wherein said source and said drain of each of said memory cells in each of the columns are electrically connected together to form sourcelines and bitlines respectively, said sourcelines and said bitlines comprise buried diffusion regions in a semiconductor substrate.

14. A memory array including a plurality of memory sectors, each of the memory sectors having a plurality of memory cells in which each of the memory cells includes a first and a second control gate, such that a simultaneous energization of the first and second control gates enables the addressing of each of the memory cells, each of said memory sectors comprising:

a plurality of sub-arrays, each of said sub-arrays includes a plurality of memory cells arranged in a matrix of rows and columns, with the first control gate of each of the memory cells in a row being electrically connected, thereby forming a plurality of X-address lines, and with the second control gate of each of the memory cells in a column being electrically connected together, thereby forming a plurality of Y-address lines;

a plurality of row address lines; and a plurality of column address lines, said plurality of row and column address lines being operatively connected to said sub-arrays such that a simultaneous energization of a pair of address lines selected from each of said row and column address lines enables the selective addressing one of said sub-arrays;

wherein said plurality of memory sectors are operatively connected together with corresponding X-address, Y-address, row address and column address lines in each of said memory sectors being electrically connected together, thereby enabling each of the memory cells in each of the sub-arrays in each of the memory sectors to be selectively addressable via a simultaneous energization of a set of address lines selected from said X-address, Y-address, row address and column address lines.

15. The memory array as set forth in claim 14 further comprising a row addressing circuit electrically disposed between said sub-arrays and said plurality of row address lines in each of said memory sectors, and a column addressing circuit electrically disposed between said sub-arrays and said plurality of column address lines in each of said memory sectors, said row and said column addressing circuit being controlled by said row and said column address lines, respectively.

16. The memory array as set forth in claim 15 further comprising a register circuit electrically disposed between said column addressing circuit and said plurality of sub-arrays in each of said memory sectors, such that during programming, data are cumulatively stored in said register circuit by said column addressing circuit in response to the energization of said column address lines before being programmed in said sub-arrays in each of said memory sectors.

17. The memory array as set forth in claim 16 wherein said register circuit comprises a plurality of master and slave circuit portions, wherein said data are cumulatively stored in said master circuit portions and transferred to said slave circuit portions within a first predetermined time period, thereby allowing said data in said slave circuit portions to be programmed in said sub-arrays during a second predetermined time period, and thereby simultaneously allowing other data to be cumulatively stored in said master circuit portions during said second predetermined time period.

18. A W-bit-wide memory circuit having W memory sectors and N address lines formed in a semiconductor substrate, each of said W memory sectors comprising:
 a plurality of sub-arrays arranged in a first matrix of P rows and Q columns, each of said sub-arrays comprising a plurality of memory cells arranged in a second matrix of R rows and S columns, wherein the mathematical sum of P, Q, R and S equals N; N being an integer;
 a row addressing circuit controlled by P row address lines;
 a column addressing circuit controlled by Q column address lines, said row and column addressing circuits being operatively connected to said plurality of sub-arrays such that a simultaneous energization of a pair of address lines selected from each of said P row and Q column address lines enables the selective addressing of one of said sub-arrays;
 R X-address lines traversing each of said sub-arrays;
 S Y-address lines traversing each of said sub-arrays, said S Y-address lines being formed on the semiconductor substrate substantially perpendicular to said R X-address lines, such that a simultaneous energization of a pair of address lines selected from each of said R X-address and S Y-address lines enables the selective addressing of one of said memory cells in said addressed sub-array.

19. A W-bit wide memory circuit including Q memory sectors having N address lines formed in a semiconductor substrate, each of said Q memory sectors comprising:
 a plurality of sub-arrays arranged in a first matrix of P rows and Q columns, each of said sub-arrays comprising a plurality of memory cells arranged in a second matrix of R rows and S columns, wherein the mathematical sum of P, Q, R and S equals N; N being an integer;
 a row addressing circuit controlled by P row address lines;
 a column addressing circuit controlled by Q column address lines, said row and column addressing circuits being operatively connected to each of said Q memory sectors such that a simultaneous energization of a pair of address lines selected from each of said P row and Q column address lines enables the selective addressing of one of said sub-arrays;
 R X-address lines traversing each of said sub-arrays; and
 S Y-address lines traversing each of said sub-arrays, said S Y-address lines being formed on the semiconductor substrate substantially perpendicular to said R X-address lines, such that a simultaneous energization of a pair of address lines selected from each of said R X-address and S Y-address lines enables the selective addressing of one of said memory cells in said addressed sub-array.

20. The W-bit-wide memory circuit as set forth in claim 19 further comprising Q register circuits electrically disposed between said column addressing circuit and said Q memory sectors, such that during programming, data are cumulatively stored in said Q register circuits by said column addressing circuit in response to the energization of said column address lines before being programmed in said sub-arrays in said memory sectors.

21. The W-bit-wide memory circuit as set forth in claim 20 wherein each of said Q register circuits comprises a W master and W slave circuit portions, wherein the data are cumulatively stored in said W master circuit portions and transferred to said W slave circuit portions within a first predetermined time period, thereby allowing the data in said W slave circuit portions to be programmed in said sub-arrays during a second predetermined time period, and thereby simultaneously allowing other data to be cumulatively stored in said W master circuit portions during said second predetermined time period.

22. The W-bit wide memory circuit as set forth in claim 21 wherein said row addressing circuit and said column addressing circuit comprise metal oxide semiconductor field effect transistors.

* * * * *